United States Patent
Perthold et al.

(10) Patent No.: US 6,630,862 B1
(45) Date of Patent: Oct. 7, 2003

(54) SYSTEM FOR PRE-DISTORTING AN INPUT SIGNAL FOR A POWER AMPLIFIER USING-NON-ORTHOGONAL COORDINATES

(75) Inventors: Rainer Perthold, Weisendorf (DE); Gerald Ulbricht, Roethenbach (DE); Heinz Gerhaeuser, Waischenfeld (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 09/914,580
(22) PCT Filed: Feb. 24, 2000
(86) PCT No.: PCT/EP00/01542
§ 371 (c)(1),
(2), (4) Date: Aug. 29, 2001
(87) PCT Pub. No.: WO01/63752
PCT Pub. Date: Aug. 30, 2001

(51) Int. Cl.$^7$ ................................................. H03F 1/26
(52) U.S. Cl. ........................................ 330/149; 330/136
(58) Field of Search ........................ 330/2, 136, 149; 375/297

(56) References Cited

U.S. PATENT DOCUMENTS 6,141,390 A * 10/2000 Cova ........................ 330/149 X
6,320,463 B1 * 11/2001 Leva et al. .................. 330/149

* cited by examiner

Primary Examiner—Steven J. Mottola
(74) Attorney, Agent, or Firm—Dougherty, Clements & Hofer

(57) ABSTRACT

A circuit for pre-distorting an input signal v to be transmitted via a power amplifier having a non-linear transmission characteristic to produce a pre-distorted input signal y comprises an estimator (10) for determining an estimation signal (22) based on the power of said input signal v. A look-up table (20) is provided for storing complex pre-distortion coefficients $B_R$ and $A_I$ which depend on the power of the input Signal v and the non-linear transmission characteristic of the power amplifier determined in advance. For $B_R$, the relation $B_R = A_R - K$, K being a constant with $0 < K < 2$ applies, and $A_R$ and $A_I$ are the real and imaginary parts of a complex pre-distortion function which provides a pre-distortion of the input signal v such that the distortion introduced by the non-linear transmission characteristic of the power amplifier is substantially compensated according to magnitude and phase. Finally, a pre-distorter is provided in order to pre-distort the input signal according to $y = v \cdot (K + B_R + jA_I)$.

12 Claims, 2 Drawing Sheets

SYSTEM FOR PRE-DISTORTING AN INPUT SIGNAL FOR A POWER AMPLIFIER USING NON-ORTHOGONAL COORDINATES

The present invention relates to a circuit and a method for pre-distorting an input signal to be transmitted via a power amplifier having a non-linear transmission characteristic using non-orthogonal coordinates in order to compensate for level-dependent non-linearities of the gain of the amplifier.

The present invention can be used for conducting a pretreatment of input signals formed using modulation methods which result in a non-constant envelope of the radio frequency carrier signal. Thus, the present invention preferably finds use in transmitters for digital broadcasting, which are fed by multi-carrier signals, such as OFDM signals (OFDM=orthogonal frequency division multiplex), for example. With such signals, the non-linearity of the amplifier causes unwanted frequency portions of the signal at the output of the amplifier. Such frequency portions interfer with adjacent-frequency channels.

In addition, the present invention is applicable to mobile communication systems using CDMA signals (CDMA= code division multiple access), for example. Additionally, the present invention can be advantageously used in satellite earth stations or base stations of mobile telephone systems.

A multitude of systems is known for pre-distorting the input signal to be transmitted via a RF power amplifier such that non-linear distortions caused by the output stage, i.e., the RF power amplifier, are compensated for as far as possible. The non-linear distortions are described by AM/AM and AM/PM characteristic curves in case of memory-free amplifiers. A system for performing an amplifier linearization by adaptive pre-distortion is described in U.S. Pat. No. 5,049,832.

A pre-distorter having a structure as described in U.S. Pat. No. 5,049,832 is shown in FIG. 3 of the present application. Squared magnitude values of a complex baseband signal v(k) representing the input signal to a power amplifier, are derived in a unit 10. k is a running index in the direction of the time axis for respective samples. Unit 10 derives the sum of squares of the magnitude of the real and imaginary parts of the complex base-band signal v(k), i.e., $|I^2+Q^2|$. Based on the squared magnitude values, a look-up table 12 is accessed. Each table entry of the look-up table 12 is associated with a section of squared magnitude values. Thus, section-wise constant pre-distortion coefficients are stored in the look-up table 12. The table entries for respective squared magnitude values are set to provide pre-distortion for the input signal v(k) which compensates for level-dependent non-linearities of the gain of the power amplifier (not shown in FIG. 3). For any input power, the optimum value of the complex gain of the pre-distortion, i.e., the table entries, is determined by equating the composite pre-distorter/power amplifier non-linearity to a nominal constant amplitude gain of the power amplifier.

The input signal v(k) is pre-distorted by the table entries using a pre-distorter 14. The pre-distorted input signal v'(k) is applied to the power amplifier. The pre-distorter 14 performs a complex multiplication of the complex input signal v(k) by the complex table entries obtained from the look-up table 12. A respective table entry is formed by a complex pre-distortion coefficient composed of a real part $A_R$ and an imaginary part $A_I$. The complex pre-distortion coefficients are stored in the look-up table 12 in rectangular coordinates. Thus, the pre-distorted input signal v'(k) is obtained by pre-distorting the input signal using complex pre-distortion coefficients stored in orthogonal coordinates in the look-up table 12. A predistortion according to the following equation is performed by the pre-distorter 14 shown in FIG. 3:

$$v'(k)=v(k)\cdot A(n)$$

wherein k is a running index in the time axis, and $$n=f(v(k));$$

To be more specific:

$$v'(k)=(RE\{v(k)\}+jIm\{v(k)\})\cdot(A_R(n)+jA_I(n))$$

The system described in U.S. Pat. No. 5,049,832 is able to conduct a pre-distortion of an input signal through the entire complex plane. Thus, theoretically, AM/AM and AM/PM distortions of any extent can be compensated for. However, as a result, a look-up table having an adequate word length has to be used.

It is the object of the present invention to provide a system for performing a pre-distortion of an input signal to be transmitted via a power amplifier, which enables usage of a look-up table having a reduced size for storing complex pre-distortion coefficients.

This object is achieved by a circuit according to claim 1 and a method according to claim 7.

The present invention provides a circuit for pre-distorting an input signal v to be transmitted via a power amplifier having a non-linear transmission characteristic to produce a pre-distorted input signal, the circuit comprising:

an estimator for determining an estimation signal based on the power of said input signal;

a look-up table for storing complex pre-distortion coefficients $B_R$ and $A_I$ which depend on the power of said input signal and the non-linear transmission characteristic of the power amplifier determined in advance, wherein $B_R=A_R-K$, K being a constant with 0<K<2, and $A_R$ and $A_I$ are the real and imaginary parts of a complex pre-distortion function A which provides a pre-distortion of the input signal v such that the distortion introduced by the non-linear transmission characteristic is substantially compensated according to magnitude and phase; and a pre-distorter for pre-distorting the input signal according to $y=v\cdot(K+B_R+jA_I)$.

The present invention is based on the recognition that it is possible to realize an adaptive pre-distortion with reduced expense. The inventors recognized that power amplifiers used in practice have typically limited phase errors and amplitude errors. For example, semiconductor output stages used in practice have a typical maximum phase error of ±5° and a maximum amplitude error of approximately 2 dB. Similarily, travelling wave tubes exhibit a maximum phase error of approximately 30° and an amplitude error of approximately 5 dB.

The fact that power amplifiers used in practice have limited phase errors and amplitude errors will make significant simplification of prior art realizations of pre-distorting systems possible. In particular, in case of realizations using field programmable gate arrays (FPGA), substantial cost savings will be obtained.

Generally, a pre-distortion of a digital complex input signal to be transmitted via a power amplifier having a non-linear transmission characteristic can be described as follows:

$$y(k)=v(k)\cdot A(f(v(k)))$$

wherein v is the complex input signal, y is the complex pre-distorted input signal (i.e., the output signal of the pre-distorter) and A is the complex correction value for the AM/AM and AM/PM distortions of the power amplifier which depend on the amplitude of the input signal v. f is a function appropriate for determining the amplitude or the squared amplitude of the input signal v. Both the amplitude and the squared amplitude are a measure for the power of the input signal. k is a running index in the direction of the time axis indicating respective sample times. The complex correction value A is stored in the form of a table containing real and imaginary pre-distortion coefficients which are preferably adaptively obtained from a comparison of the output signal of the power amplifier and the input signal fed to the amplifier.

Now, the present invention makes use of the fact that the range of values of A is limited with respect to the magnitude of the complex correction coefficients $A_R$ and $A_I$ which build up the correction function A. Actually, power amplifier used in practice only require a pre-distortion of typically up to 5° and 2 dB. The assumption mentioned above provides space for practical inexpensive realizations which are based on an implementation of the multiplication v·A in a non-orthogonal coordinate system, rather than in a Cartesian or polar coordinate system as it is the case in prior art solutions.

For the real part, $A_R$ of the complex pre-distortion coefficients, the following relation applies:

$$(1-a) < A_R < (1+a).$$

For the imaginary part $A_I$ of the complex pre-distortion coefficients, the following equation applies:

$$-b < A_I < B.$$

Thus, $A_R$ accepts values in a range adjacent to one, whereas $A_I$ accepts values in a range adjacent to zero. Having the above relations in mind, the inventors recognized that a look-up table having a reduced word length can be used in case $A_R - K$ is stored in the look-up table rather than $A_R$, wherein K is a constant with $0 < K < 2$. Due to the range of values of the real coefficient $A_R$ mentioned above, best result will be achieved in case the constant K is set to be one. However, a reduction of the word length can be achieved as long as K is chosen to be greater than 0 and not greater than 2.

Thus, $B_R = A_R - K$ is stored as the real pre-distortion coefficients in the look-up table.

This modification of the stored real coefficient has to be compensated for in the pre-distorter which is coupled with the input signal and the look-up table. Therefore, the pre-distortion. conducted by the pre-distorter has to meet the following equation:

$$y(k) = (RE\{v(k)\} + jIm\{v(k)\}) \cdot (K + B_R(n) + jA_I(n))$$

wherein $n = f(v(k))$.

A further improvement can be achieved in case $B_R$ and $A_I$ are limited to +/−0,125. In this case, the word length at one input of the multiplier used in the pre-distorter can be reduced by three bits. Limiting $B_R$ and $A_I$, to the value mentioned above, maximum amplitude errors of the power amplifier up to −2,13 dB and phase errors of ±7° can be compensated for. Such a compensation is sufficient for practically used semiconductor amplifiers or klystrons, for example.

Thus, the inventors recognized that an inexpensive implementation for conducting a pre-distortion of an input signal of a power amplifier can be achieved in case the orthogonality of the complex pre-distortion values stored in the look-up table is given up.

Preferred embodiments of the present invention are explained hereinafter referring to the enclosed drawings, in which.

Figure 1:
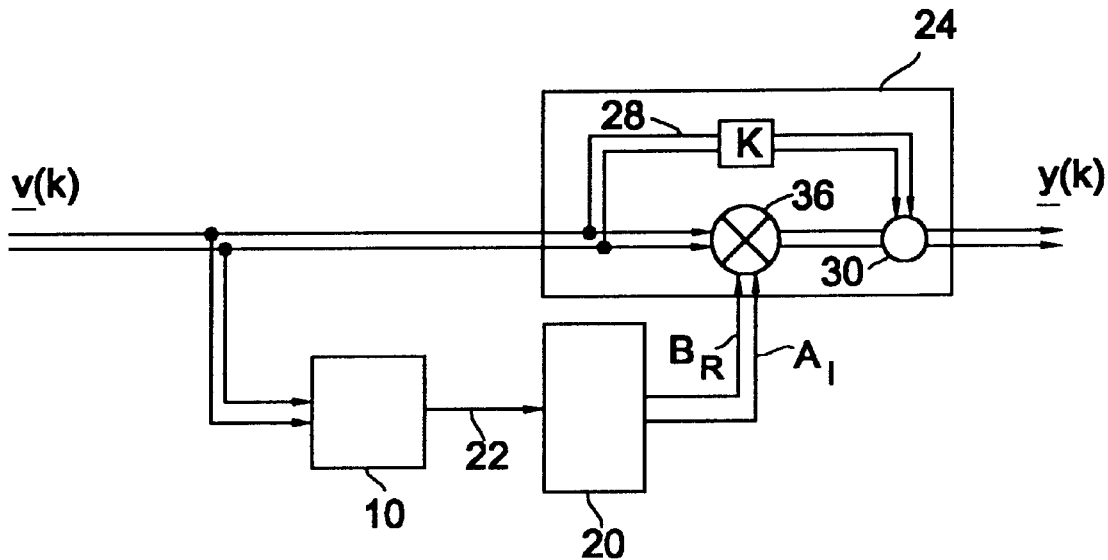
FIG. 1 is a schematic representation of a preferred embodiment of the inventive circuit for pre-distorting an input signal for a power amplifier.

A preferred embodiment of the present invention is shown in FIG. 1. A complex input signal v(k), an OFDM signal, for example, is a complex digital signal having a running index k in the embodiment shown in FIG. 1. In accordance with the inventive circuit for performing a pre-distortion, the input signal v(k) is applied to an estimation means 10 for determining an estimation signal based on the power of the input signal v(k). The estimation means 10 may determine the estimation signal based on the amplitude of the input signal or based on the squared amplitude of the input signal. Both the amplitude and the squared amplitude are a measure for the power of the input signal. In case of a digital input signal, the estimator 10 is preferably a unit for deriving the sum of squares of the magnitude of the real and imaginary parts of the input signal, i.e., $|I^2 + Q^2|$. In case of an analog input signal, the estimator would preferably be an envelope detector for detecting an envelope of the signal along with a quantizer for forming quantized envelope values on the basis of the detected envelope.

The estimator 10 is connected to a look-up table 20 in which complex pre-distortion coefficients $B_R(f(v(k)))$ and $A_I(f(v(k)))$ are stored. As it has been explained hereinbefore, the coefficient $B_R$ is obtained from the real pre-distortion coefficient $A_I$ used in prior art pre-distorters by subtracting K according to the equation $B_R = A_R - K$. In the preferred embodiments of the present invention, the constant K is set to be one.

The look-up table 20 is accessed on the basis of the estimation signal 22 determined by the estimator 10 in order to apply the pre-distortion coefficients $B_R$ and $A_I$ to a pre-distorter 24. In addition, the input signal v(k) is applied to the pre-distorter 24. A pre-distortion according to $$y(k) = (RE\{v(k)\} + jIm\{v(k)\}) \cdot (K + B_R(n) + jA_I(n))$$

wherein $n = f(v(k))$.
is performed in the pre-distorter 24 in order to produce a pre-distorted signal y(k) to be applied to the output stage, i.e., the power amplifier. To this end, the pre-distorter 24 comprises a multiplication unit 26 and a bypass path 28 for bypassing the multiplication unit 26, wherein the bypass path 28 is provided in order to multiply the input signal v(k) by the constant K. In the preferred embodiment of the present invention, the constant K is 1 and therefore the bypass 28 is a simple bridge between the input of the multiplication unit 28 and the output thereof. A combining unit 30 is provided in order to combine the output of the multiplication unit 26 and the output of the bypass path 28. Thus, the pre-distorted input signal y(k) is obtained according to the equation mentioned above.

It is to be noted that, in case of a digital input signal, the pre-distorted signal is applied to a digital-to-analog converter before it is applied to the power amplifier. In addition, an up-converter using a pre-determined carrier frequency is provided in front of the power amplifier. In addition, means for dynamically or periodically adapting the coefficients stored in the look-up table 20 can be provided.

As to the determination of the coefficients of the look-up table 20 and as to means for adapting the coefficients to real ambient conditions, reference is made to U.S. Pat. No. 5,049,832, for example.

Alternatively, the complex pre-distortibn coefficients can be determined as follows. The non-linearity of an amplifier can be estimated by recording the input signal and the output signal of the amplifier, compensating for time delays and phase shifts between the signals at the input and the output of the amplifier, associating all samples of the input signals with samples of the output signal, averaging respective input and output values in order to provide an AM/AM characteristic and an AM/PM characteristic having a number of respective checkpoints, for example 128, assessing the reliability of the checkpoints using standard deviations of magnitudes and phases selecting checkpoints which are sufficiently reliable and interpolating the checkpoints assessed as sufficiently reliable in order to produce the AM/AM and AM/PM characteristics. Thus, a non-linear characteristic of an amplifier is estimated, wherein influences of measuring errors on the result of the estimation can be reduced. For determining the pre-distdrtion coefficients for the pre-distorting unit from the estimation of the non-linear characteristic of the power amplifier, the required inverse function can easily be obtained prior to the interpolation of the. AM/AM characteristic and the AM/PM characteristic by exchanging the coordinates of the checkpoints, i.e., by exchanging input and output values. Moreover, it is clear that appropriate delay means can be provided in order to compensate for any delay times caused in any of the signal paths shown in FIG. 1 of the present application.

As has been mentioned above, section-wise constant pre-distortion coefficients are stored in the look-up table 20. That is, a complex pre-distortion coefficient being obtained for each input signal amplitude or each input signal power in a certain graduation. It follows that the non-linear amplification of the power amplifier is section-wise linearized, wherein the resolution, i.e., the number of linearizations in a specific amplitude range depends on the demands as well as on the available storage capacity of the look-up table 20. The resolution mentioned above, i.e., the quantization level, is decisive for the quantization noise produced due to the section-wise linearization. Now, the required word length is determined by the permissible quantization noise. In case the pre-distortion is not conducted throughout the whole complex plane due to the assumptions outlined in the introductory portion of the specification of the present application, a sufficient small quantization level will be achieved even if a look-up table having a reduced word length is used. In accordance with the present invention, the word length of the look-up table 20 can be cut off starting at the most significant bit, rather than at the least significant bit. Thus, complex coefficients having sufficient accuracy can be stored in a look-up table having a reduced word length according to the present invention. Since complex coefficients having a reduced word length can be stored in the look-up table 20, the word length at the input of the pre-distorter 24 receiving the complex coefficients can be reduced.

Figure 2:
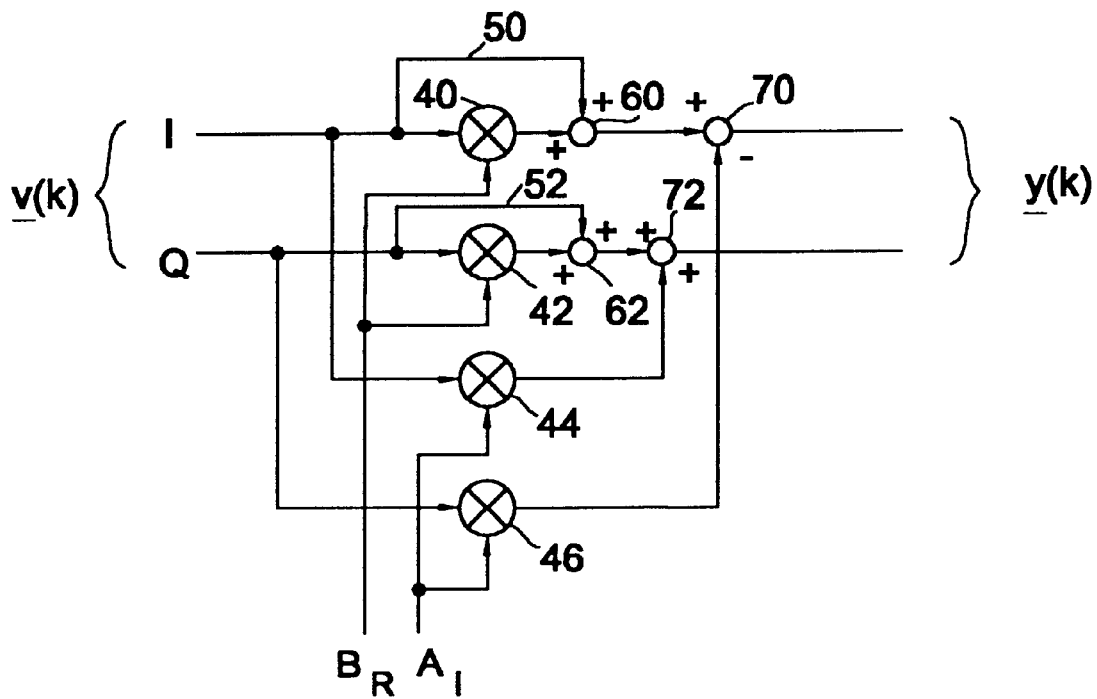
FIG. 2 is a schematic representation of a detail of the inventive circuit for pre-distorting an input signal to a power amplifier shown in FIG. 1.
Figure 3:
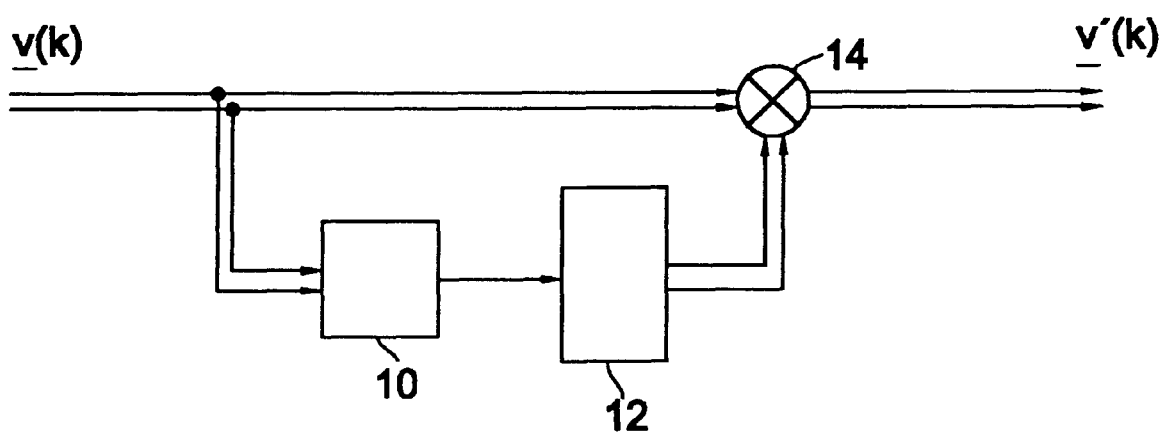
FIG. 3 is a schematic view of a prior art circuit for pre-distorting an input signal to a power amplifier.

A realization of an inventive pre-distorter 24 is shown in FIG. 2. The pre-distorter comprises four multipliers 40, 42, 44 and 46. The multiplier 40 is provided for multiplying the real part I of the input signal by the complex coefficient $B_R$. The multiplier 42 is provided in order to multiply the imaginary part Q of the input signal by the complex coefficient $B_R$. The multiplier 44 is provided in order to multiply the real part I of the input signal by the complex coefficient $A_I$. The multiplier 46 is provided in order to multiply the imaginary part Q of the input signal by the pre-distortion coefficient $A_I$. In addition, a first bypass 50 bypassing the multiplier 40 and a second bypass 52 bypassing the multiplier 42 are provided. A first adder 60 is provided connected to the multiplier 40 and the bypass 50 and a second adder 62 is provided connected to the multiplier 42 and the bypass 52. The output signal of the multiplier 46 is subtracted from the output signal of the adder 60 by a subtractor 70. The output of the multiplier 44 and the output of the adder 62 are added using an adder 72. The output of the subtractor 70 forms the real part of the pre-distorted signal y(k) and the output of the adder 72 forms the imaginary part of the pre-distorted signal y(k).

It should be noted that a single combining element could be used, rather than separate elements 60 and 70 and 62 and 72, respectively. In addition, it depends on the signs of the respective signals as to whether adders or subtractors are defined as combining means 60, 70, 62, 72.

In case of an analog input signal, the pre-distorter for conducting the pre-distortion according to $y = v \cdot (K+B_R+jA_I)$ can be formed by an IQ modulator and a respective bypass path in order to provide an implementation for the pre-distortion defined in the above equation. In case of an analog input signal, a digital-to-analog converter has to be provided in order to convert the complex coefficients before applying them to the distorter.

What is claimed is:

1. A circuit for pre-distorting an input signal v to be transmitted via a power amplifier having a non-linear transmission characteristic to produce a pre-distorted input signal y, the circuit comprising:

an estimator for determining an estimation signal (22) based on the power of said input signal;

a look-up table for storing complex pre-distortion coefficients $B_R$ and $A_I$ which depend on the power of said input signal v and the non-linear transmission characteristic of said power amplifier determined in advance, wherein $B_R = A_R - K$, K being a constant with $0 < K < 2$, and $A_R$ and $A_I$ are the real and imaginary parts respectively of a complex pre-distortion function A which provides a pre-distortion of the input signal v such that the distortion introduced by the non-linear transmission characteristic is substantially compensated for according to magnitude and phase; and a pre-distorter for pre-distorting the input signal according to $y = v \cdot (K + B_R + jA_I)$.

2. A circuit according to claim 1, wherein said input signal v is a complex digital input signal v(k), wherein k is a sampling index in the time axis.

3. A circuit according to claim 2, wherein the pre-distorter (24) comprises a complex multiplication unit (26) for complex multiplying said input signal v(k) by said pre-distortion coefficients $B_R$ and $A_I$, a bypass path (28) for passing said input signal v(k) past said multiplication unit (26) and for multiplying said input signal v(k) by the constant K, and a unit (30) for combining the outputs of said multiplication unit (26) and said bypass path (28).

4. A circuit according to claim 1, wherein said input signal is an analog input signal, wherein said pre-distorter comprises an IQ modulator for applying said complex coefficients to said input signal, a bypass path for passing said input signal past said multiplication unit and for multiplying said input signal by the constant K, and a unit for combining the output of said IQ modulator and said bypass path.

5. A circuit according to one of claims 1 to 4, wherein the constant K is set to be one.

6. A circuit according to one of claims 1 to 5, wherein the values of the complex pre-distortion coefficients are limited to pre-determined values, such that the work length of the complex pre-distortion coefficients in the look-up table (20) can be reduced compared with a case in which $A_R$ is stored in the look-up table.

7. A method for pre-distorting an input signal v to be transmitted via a power amplifier having a non-linear transmission characteristic to produce a pre-distorted input signal y, comprising the steps of:

determining an estimation signal based on the power of said input signal v;

accessing, on the basis of said estimation signal, complex pre-distortion coefficients $B_R$ and $A_I$ stored in a look-up table, wherein the complex pre-distortion coefficients depend on the power of said input signal v and the non-linear transmission characteristic of said power amplifier determined in advance, wherein $B_R = A_R - K$, K being a constant with $0 < K < 2$, and $A_R$ and $A_I$ being the real and imaginary parts of a complex pre-distortion function A which provides a pre-distortion of the input signal v such that the distortion introduced by the non-linear transmission characteristic is substantially compensated for according to magnitude and phase; and pre-distorting the input signal according to $y = v \cdot (K + B_R + jA_I)$.

8. A method according to claim 7, wherein said input signal v is a complex digital input signal v(k), wherein k is a running index in the time axis.

9. A method according to claim 8, wherein the step of pre-distorting said input signal v(k) comprises the steps of:

(a) complex multiplying said input signal v(k) by said complex pre-distortion coefficients $B_R$ and $A_I$;

(b) multiplying said input signal v(k) by said constant K, and (c) combining the signals obtained in steps (a) and (b) in order to obtain said pre-distorted input signal y(k).

10. A method according to claim 7, wherein the input signal is an analog signal and a step of pre-distorting said input signal comprises the steps of:

(a) performing an IQ modulation of said input signal using said complex pre-distortion coefficients;

(b) multiplying said input signal by said constant K, and (c) combining the signals obtained in steps (a) and (b) in order to obtain said pre-distorted input signal.

11. A method according to one of claims 8 to 10, wherein the constant K is set to be one.

12. A method according to one of claims 8 to 11, wherein the values of the complex pre-distortion coefficients are limited to pre-determined values, such that the word length of the complex pre-distortion coefficients in the look-up table (20) can be reduced compared with a case in which $A_R$ is stored in the look-up table.

* * * * *